United States Patent
Deguchi et al.

(10) Patent No.: US 7,003,962 B2
(45) Date of Patent: Feb. 28, 2006

(54) THERMOELECTRIC TRANSDUCER, A MANUFACTURING METHOD THEREOF, A COOLING DEVICE USING THE SAME, AND A METHOD FOR CONTROLLING THE COOLING DEVICE

(75) Inventors: Masahiro Deguchi, Hirakata (JP); Akira Taomoto, Kyotanabe (JP); Toyokazu Ozaki, Nara (JP); Motoshi Shibata, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/050,812

(22) Filed: Jan. 27, 2005

(65) Prior Publication Data

US 2005/0134167 A1    Jun. 23, 2005

Related U.S. Application Data

(63) Continuation of application No. PCT/JP04/13858, filed on Sep. 15, 2004.

(30) Foreign Application Priority Data

Oct. 7, 2003    (JP) ............................. 2003-348181

(51) Int. Cl.
*F25B 21/02* (2006.01)
(52) U.S. Cl. ........................................... 62/3.2; 62/3.1
(58) Field of Classification Search .................. 62/3.1, 62/3.2, 3.7, 259.2; 313/310, 311
See application file for complete search history.

(56) References Cited

U.S. PATENT DOCUMENTS

| | | | |
|---|---|---|---|
| 5,254,178 A | * | 10/1993 | Yamada et al. ............. 136/204 |
| 5,675,972 A | | 10/1997 | Edelson |
| 5,777,427 A | | 7/1998 | Tanaka et al. |
| 6,396,191 B1 | | 5/2002 | Hagelstein et al. |

FOREIGN PATENT DOCUMENTS

| | | | |
|---|---|---|---|
| EP | 1 278 227 A1 | 1/2003 | |
| JP | 5-342983 | * 12/1993 | ................. 313/311 |
| JP | 10-012937 | 1/1998 | |
| JP | 2002-540636 | 11/2002 | |
| JP | 2003-250285 | 9/2003 | |
| JP | 2003-258326 | 9/2003 | |
| JP | 08-321256 | 12/2003 | |
| WO | WO 00/59047 | 10/2000 | |
| WO | WO 01/71759 A1 | 9/2001 | |
| WO | WO 2001/069657 A2 | 9/2001 | |

* cited by examiner

*Primary Examiner*—Melvin Jones
(74) *Attorney, Agent, or Firm*—McDermott Will & Emery LLP

(57) ABSTRACT

A thermoelectric transducer comprising an emitter (1) for emitting electrons according to the action of heat or an electric field, a collector (2) disposed so as to face the emitter (1) and collect electrons emitted from the emitter (1), and an electron transport layer (3) held between the emitter (1) and the collector (2) to serve as a region for transferring the electrons emitted from the emitter (1), the electron transport layer (3) being a porous body having a mixed structure of a vapor phase and a solid phase, the entire solid phase which composes the porous body being composed of an insulating material, and the electrons emitted from the emitter traveling in the vapor phase by applying an electric potential to the collector (2) that is higher than that applied to the emitter (1).

17 Claims, 3 Drawing Sheets

(a)

(b)

(c)

ically connected to the emitter 1 are cooled. On the other hand, the collector 2 to which the electrons 5 holding energy are supplied and the object that is thermally connected to the collector 2 are heated.

THERMOELECTRIC TRANSDUCER, A MANUFACTURING METHOD THEREOF, A COOLING DEVICE USING THE SAME, AND A METHOD FOR CONTROLLING THE COOLING DEVICE

REFERENCE TO RELATED APPLICATION

This Application is a continuation of International Application No. PCT/JP2004/013858, whose international filing date is Sep. 15, 2004, which in turn claims the benefit of Japanese Application No. 2003-348181, filed Oct. 7, 2003, the disclosures of which Applications are incorporated by reference herein. The benefit of the filing and priority dates of the International and Japanese Applications is respectfully requested.

BACKGROUND OF THE INVENTION (1) Field of the Invention

The present invention relates to a solid-type thermoelectric transducer that achieves cooling operation by using thermoelectrons and field emission electrons. In particular, the present invention relates to a thermoelectric transducer comprising an electron transport layer having a porous structure in which a solid phase, composed of fine particles of an electrically non-conductive insulating material, and a vapor phase coexist, a manufacturing method thereof, a cooling device using the thermoelectric transducer, and a method for controlling the cooling device.

(2) Description of the Related Art

Thermoelectric transducers that achieve cooling operation by emitting electrons by using emitter materials that are able to easily emit electrons due to the action of heat or an electric field are disclosed in, for example, Journal of Applied Physics, Vol. 76, No. 7 (1994), page 4362, (hereunder referred to as Document 1); Applied Physics Letters, Vol. 78, No. 17 (2001), page 2572, (hereunder referred to as Document 2); and U.S. Pat. No. 5,675,972 (hereunder referred to as Document 3).

FIG. 4(a) is a cross-sectional view showing the basic structure of the prior art thermoelectric transducers disclosed in the above-mentioned documents 1 to 3 (prior art example 1). The basic operating principle of a thermoelectric transducer is explained with reference to FIG. 4(a).

The thermoelectric transducer shown in FIG. 4(a) comprises an emitter 1 that is connected to an object to be cooled (not shown) in such a manner that heat is exchangeable between the emitter 1 and the object to be cooled (hereunder referred to as "thermally connected"), a collector 2 thermally connected to an object to be heated (not shown), and a power supply 4 for applying voltage across these electrodes. The emitter 1 and the collector 2 are arranged so as to oppose each other having a fine gap formed by using spacers 11, etc., in between, wherein the gap between the emitter 1 and the collector 2 is a vacuum space 10 (vapor phase).

If a positive voltage is applied to the collector 2 of this element and a negative voltage is applied to the emitter 1 when the surface of the emitter 1 is in a condition that allows electrons to be easily emitted in the vacuum space 10, i.e., when it has a low work function, electrons 5 will be emitted by thermal action and/or electric-field action at a certain threshold or above. The emitted electrons 5 travel from the emitter 1 to the collector 2 using the vacuum space 10 as an electron transfer path.

In this case, the electrons 5 emitted from the emitter 1 are taken into the collector 2 retaining the energy that they held when they were inside the emitter 1. In other words, by making electrons 5 travel between the emitter 1 and the collector 2 through the vacuum fine gap, it becomes possible to transfer the heat of the emitter 1 to the collector 2. Therefore, the emitter 1 and the object thermally connected to the emitter 1 are cooled. On the other hand, the collector 2 to which the electrons 5 holding energy are supplied and the object that is thermally connected to the collector 2 are heated.

The above operation can be summarized as follows: By applying a voltage to the thermoelectric transducer and causing electrons to be emitted from the emitter 1, the periphery of the emitter 1 is cooled by endothermic action and the periphery of the collector 2 is heated by heat dissipation.

To operate such a thermoelectric transducer efficiently, a means for easily emitting the electrons 5 is important, and, for that purpose, the formation of an emitter material with a low work function and the formation of the fine gap structure are necessary.

Furthermore, another structure of a thermoelectric transducer using the same principle is disclosed in U.S. Pat. No. 4,019,113 (hereafter referred to as Document 4). FIG. 4(b) shows the structure of the thermoelectric transducer disclosed in Document 4 (prior art example 2). This thermoelectric transducer is a solid-type that does not use a vacuum space (vapor phase) as an electron transfer path but uses a thin film 12 (solid phase). Note that, in FIG. 4(b), the same symbols are given to the same constituents as in the thermoelectric transducer (prior art example 1) shown in FIG. 4(a).

Also in this case, the operating principle is the same as that in the above-mentioned structure; however, it differs from prior art example 1 in that it uses the thin film 12 (solid phase) as the space to which electrons are emitted to enhance the efficiency of the electron emission.

Furthermore, advanced examples of this solid-type thermoelectric transducer are disclosed in U.S. Pat. No. 6,489,704 (hereafter referred to as Document 5), and national publication of the translated version of PCT application No. 2002-540636 (hereafter referred to as Document 6). The schematic structure of these solid-type thermoelectric transducers is shown in FIG. 4(c) (prior art example 3). Also in this figure, the same symbols are given to the same constituents as in the thermoelectric transducer (prior art example 1) shown in FIG. 4(a). In the thermoelectric transducer of prior art example 3, unlike the thermoelectric transducer of prior art examples 1 and 2, a performance improvement is attempted by separating a solid phase 13, which serves as an electron transfer path, and a vapor phase 14.

A cooling device using these thermoelectric transducers is characterized in that it does not have any moving elements and is smaller than conventional mechanical compressing devices, and cooling mediums, such as chlorofluocarbon, are unnecessary. Furthermore, since the theoretical cooling efficiency is also high, it is considered to be an ideal cooling device.

However, in the thermoelectric transducer of prior art example 1 disclosed in Document 3, it is necessary to form a fine gap for vacuum space 10 as shown in FIG. 4(a). Therefore, to maintain a stable thermionic transfer characteristic, it is necessary to form a very narrow space (generally about 10 to 500 nm) with high accuracy by using spacers 11 or the like, and at the same time, the space has to maintain a high vacuum. In other words, in the thermoelectric transducer of the prior art structure, it is difficult to produce a very narrow vacuum gap in a large area with sufficient accuracy.

Moreover, in the thermoelectric transducer of prior art example 2 disclosed in Document 4, although some of the problems of prior art example 1 are solved by changing the electron transfer region from a vacuum (vapor phase) to a thin film (solid phase) as shown in FIG. 4(b), because the emitter 1 to be cooled and the collector 2 to be heated contact each other through a solid-phase region (thin film 12), the electron transfer region will be significantly affected by the heat conduction from a hot part (collector 2) to a cold part (emitter 1). In other words, to maintain an efficient thermoelectric transfer characteristic, it is desirable to prevent an outflow of heat from the hot part to the cold part as much as possible; however, because the electron transfer region is a laminated structure of thin films in prior art example 2, there is a large loss (runoff of heat) due to heat conduction from the hot part to the cold part.

Furthermore, in the thermoelectric transducer of prior art example 3 disclosed in Document 5, some of the problems of prior art example 2 are solved by spatially separating the electron transfer region, which is composed of a solid phase 13, and the heat-conduction suppression region, which is composed of a vapor phase 14, as shown in FIG. 4(c), but energy loss is large because it is structured so that electrons are implanted into the solid phase 13 through a fine contact. In other words, although the thermoelectric transducer of prior art example 3 provides effective fine gap formation and prevention of heat-conduction, its efficiency is insufficient because it conducts electrons in the solid phase 13 through a fine contact.

Documents Relevant to the Present Invention

Journal of Applied Physics, Vol. 76, No. 7 (1994), page 4362

Applied Physics Letter, Vol. 78, No. 17 (2001), page 2572

Specification of U.S. Pat. No. 5,675,972

Specification of U.S. Pat. No. 4,019,113

Specification of U.S. Pat. No. 6,489,704

Specification of national publication of the translated version of PCT application No. 2002-540636

Description of WO No. 01/71759 (in this document, a display device wherein an emitter, a porous body formed by anodizing Si, a phosphor, and an anode are laminated, in this order, is disclosed).

BRIEF SUMMARY OF THE INVENTION

The present invention solves the above problems and aims to provide a thermoelectric transducer that can effectively transfer electrons and prevent heat conduction, and easily form fine gaps.

A thermoelectric transducer that can achieve the above object comprises:

an emitter for emitting electrons;

a collector disposed so as to face the emitter and collect electrons emitted from the emitter; and an electron transport layer held between the emitter and the collector;

the electron transport layer being a porous body having a structure in which a vapor phase and a solid phase coexist;

the entire solid phase being composed of an insulating material; and the electrons emitted from the emitter being made to travel in the vapor phase by applying a higher electric potential to the collector than to the emitter.

A method for manufacturing a thermoelectric transducer of the invention that achieves the above objects, the thermoelectric transducer comprising:

an emitter for emitting electrons:

a collector disposed so as to face the emitter and collect electrons emitted from the emitter; and an electron transport layer held between the emitter and the collector;

the electron transport layer being a porous body having a structure in which a vapor phase and a solid phase coexist;

the entire solid phase being composed of an insulating material; and the electrons emitted from the emitter being made to travel in the vapor phase by applying a higher electric potential to the collector than to the emitter;

the method comprising a step of forming the porous body using a sol-gel reaction.

A first cooling device of the present invention that achieves the above objects, using a thermoelectric transducer, comprises:

the thermoelectric transducer having;

an emitter for emitting electrons;

a collector disposed so as to face the emitter and collect electrons emitted from the emitter; and an electron transport layer held between the emitter and the collector;

the electron transport layer being a porous body having a structure in which a vapor phase and a solid phase coexist;

the entire solid phase being composed of an insulating material;

the electrons emitted from the emitter being made to travel in the vapor phase by applying a higher electric potential to the collector than to the emitter; and the power supply for applying a voltage across the emitter and the collector in such a manner that an electric potential higher than that applied to the emitter is applied to the collector.

A second cooling device of the present invention that achieves the above objects, using a thermoelectric transducer, comprises:

the thermoelectric transducer having;

a plurality of emitters for emitting electrons;

a plurality of collectors for collecting electrons emitted from the emitters, the plurality of collectors being disposed so as to face each of the emitters; and an electron transport layer held between the emitters and the collectors;

the electron transport layer being a porous body having a structure in which a vapor phase and a solid phase coexist;

the entire solid phase being composed of an insulating material;

the electrons emitted from the emitters being made to travel in the vapor phase by applying a higher electric potential to the collectors than to the emitters; and the driving circuit applying a voltage to the emitters and the collectors.

A method for controlling a cooling device of the present invention that achieves the above objects, using a thermoelectric transducer, wherein the cooling device comprises:

the thermoelectric transducer having;

a plurality of emitters for emitting electrons;

a plurality of collectors for collecting electrons emitted from the emitters, the plurality of collectors being disposed so as to face each of the emitters; and an electron transport layer held between the emitters and the collectors;

the electron transport layer being a porous body having a structure in which a vapor phase and a solid phase coexist;

the entire solid phase that composes the porous body being composed of an insulating material;

the electrons emitted from the emitters being made to travel in the vapor phase by applying a higher electric potential to the collectors than to the emitters; and the driving circuit applying a voltage to the emitters and the collectors;

the method comprising;

a step of making the plurality of emitters to thermally connect to a surface of an object to be cooled; and a step of controlling the driving circuit so that a voltage is applied to each emitter and collector in such a manner that the cooling distribution formed by the plurality of emitters corresponds to the temperature distribution on the surface which is thermally connected to the plurality of emitters.

DETAILED DESCRIPTION OF THE INVENTION

Embodiments of the present invention are explained below with reference to the drawings.

(First Embodiment)

Figure 1:
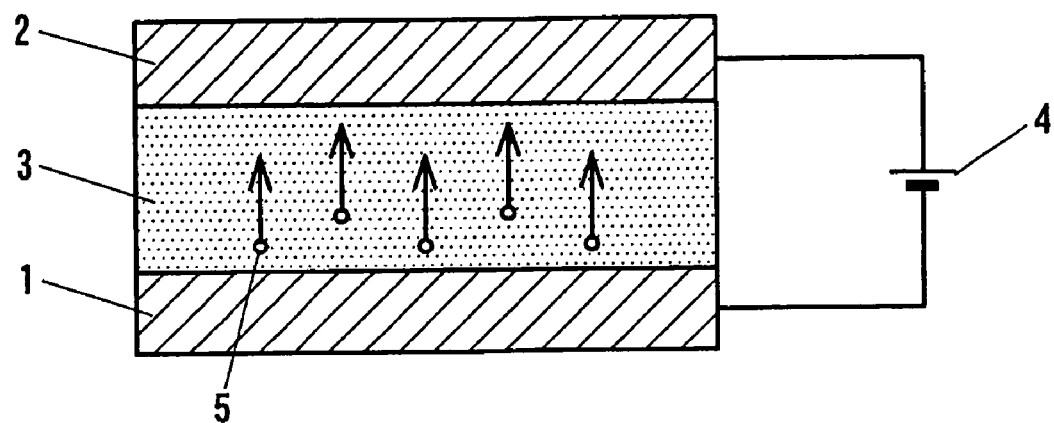
FIG. 1 is a cross-sectional view schematically showing the structure of the thermoelectric transducer according to one embodiment of the present invention.

FIG. 1 is a cross-sectional view showing the schematic structure of the thermoelectric transducer according to a first embodiment of the present invention. The thermoelectric transducer of the present embodiment comprises an emitter 1, a collector 2, and an electron transport layer 3 in which a vapor phase and a solid phase coexist and which is held between the emitter 1 and the collector 2. It is preferable that the surfaces of the emitter 1 and the electron transport layer 3 are in contact, and that the surfaces of the collector 2 and the electron transport layer 3 are also in contact, as shown in FIG. 1.

In the thermoelectric transducer of the present embodiment, a voltage is applied across the emitter 1 and the collector 2 by a power source 4 in such a manner that the electric potential of the collector 2 is higher than that of the emitter 1. In the following description, although not illustrated, it is assumed that an object to be cooled is thermally connected to the emitter 1, and an object to be heated is thermally connected to the collector 2.

The emitter 1 is capable of emitting electrons to the electron transport layer 3 by the action of heat or an electric field. In this thermoelectric transducer, there is no limitation to the material for the emitter 1 as long as it can efficiently emit electrons to the electron transport layer 3, and can be suitably selected from among common materials having a low work function. However, carbon materials (materials which use carbon as a main component), particularly carbon materials to which metallic elements are added as impurities, are especially suitable in respect of their properties, stability, etc.

Furthermore, although only a single structure is illustrated in FIG. 1 for the emitter 1, the structure is not limited to this, and the emitter may be placed on a base having high thermal conductivity. It is also possible to form the interface region between the emitter 1 and the electron transport layer 3 so that electrons are emitted more easily. For example, it is possible to form projections and depressions on the surface of the emitter 1 that is in contact with the electron transport layer 3.

The collector 2 collects the electrons 5, together with the energy that they hold, which were emitted from the emitter 1 to the electron transport layer 3. In this thermoelectric transducer, there is no limitation on the material for the collector 2 as long as it is conductive and capable of collecting the emitted electrons 5 efficiently. Generally, it can be selected from metals with high thermal conductivity. Furthermore, as the same as the emitter 1, although only the collector 2 of single structure is illustrated in FIG. 1, the structure is not limited to this, but the collector 2 may be placed on a base having high thermally conductivity, or it is also possible to form the interface region between the collector 2 and the electron transport layer 3 so that electrons are collected more easily. For example, it is possible to form projections and depressions on the surface of the collector 2 that contacts the electron transport layer 3.

In this thermoelectric transducer, the region, i.e., the electron transport layer 3, through which the electrons 5 that are emitted from the emitter 1 travel to reach the collector 2 is not a prior art single structure of vacuum (vapor phase) or thin film (solid phase), nor a structure combining them, but a mixed structure, i.e., a so-called porous structure, wherein a vapor phase and a solid phase coexist. By employing this structure, efficient electron transport and control of heat conduction, and the production of a highly precise gap structure become easier.

The porous body employed for the electron transport layer 3 is a solid material with consecutive pores or closed pores. The porous body can be produced by press molding fine particles of a base-material, baking fine-particles, chemical foaming, physical foaming, a sol-gel method, etc. In this thermoelectric transducer, as long as the porous body has many pores of nm size as explained below, preferable effects will be obtained.

Figure 2:
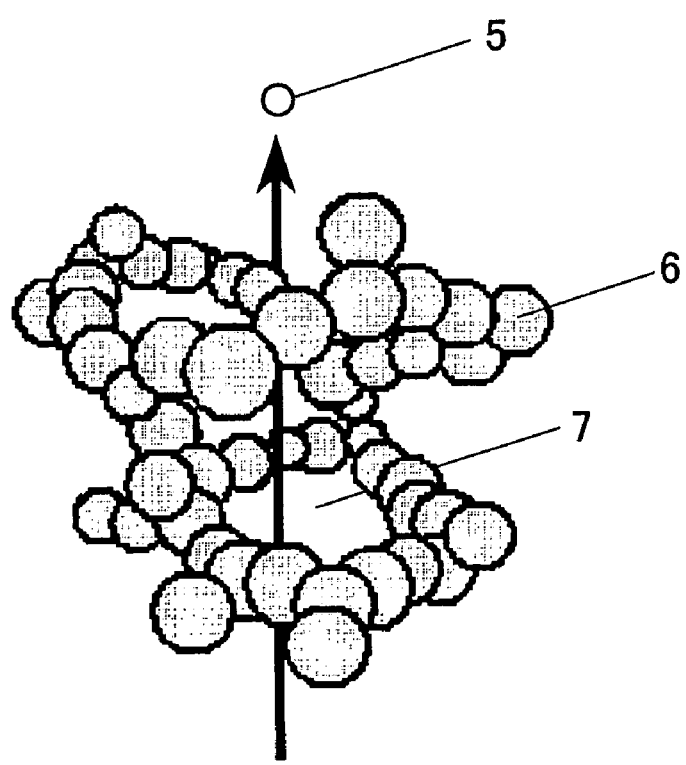
FIG. 2 is a schematic diagram showing the microscopic structure of the porous body composing the electron transport layer 3 shown in FIG. 1.

FIG. 2 is a schematic diagram showing the expanded microstructure of the porous body used for the electron transport layer 3. The porous structure comprises many consecutive pores 7 (vapor phase) whose diameters are about 20 to 50 nm and maintains its shape as a solid by means of a solid frame section 6 formed as a three-dimensional network, i.e., particles having diameters of about 3 to 20 nm are connected to each other in a three-dimensional space. It is preferable that the volume ratio of the vapor phase that is composed of consecutive pores 7 (i.e., the ratio of the volume of the consecutive pores 7 relative to the electron transport layer 3) be 85%. In other words, it is preferable that the volume ratio (i.e., the volume of the solid frame section 6 relative to the electron transport layer 3) of the solid phase which is composed of the solid frame section 6 be less than 15%. The fact that it is preferable that the diameter of the particles which constitute the solid frame section 6 be less than 20 nm and not less than 3 nm, and that the volume ratio of the solid phase composed of the solid frame section be less than 15% are explained in detail in Example 3.

When a positive voltage is applied to the collector 2, the electrons 5 emitted to the porous electron transport layer 3 can function like electrons that are transmitted in a vacuum (vapor phase) by traveling mostly in the consecutive pores 7 (vapor phase).

As a matter of course, some of the emitted electrons 5 are scattered by the solid frame section 6 which composes the solid-phase component of the porous body and lose energy; however, since the diameter of the particles which compose the solid frame section 6 is about 3 to 20 nm, it becomes possible to suppress the loss of energy and to make the emitted electrons 5 reach the collector 2.

In addition, as described later, the entire solid frame section 6 is naturally composed of an insulating material. Furthermore, it is preferable that the vapor phase formed of the consecutive pores 7 be a vacuum at the time of use (when a voltage is applied across the emitter 1 and the collector 2).

The differences between the electron transport layer 3 of the present invention and that disclosed in prior art documents are explained below. The electron transport layer 3 of the present invention is superior to that of the prior art example shown in FIG. 4(*a*) in that it has a uniform thickness. In other words, in the prior art example shown in FIG. 4(*a*), the uniformity of the thickness of the vacuum space 10 is impaired by the difference in the height of each spacer 11, consequently the emitter 1 and the collector 2 may be short-circuited or intensive electronic emission may arise in the part where the vacuum space 10 is thin; however, since the uniformity in the thickness of the electron transport layer 3 is assured in the present invention, it does not suffer from such a drawback. In particular, the electron transport layer 3 formed by the sol-gel method described later can easily assure the uniform thickness of the electron transport layer 3.

Figure 4:
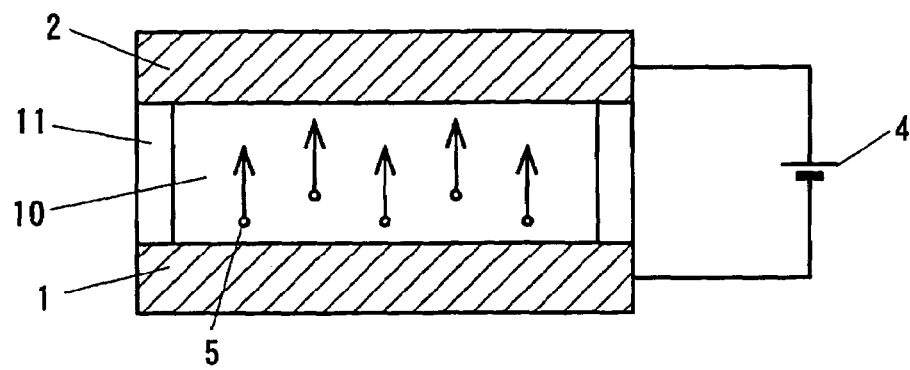
FIG. 4 is a cross-sectional view showing the schematic structure of a prior art thermoelectric transducer.
Figure 4:
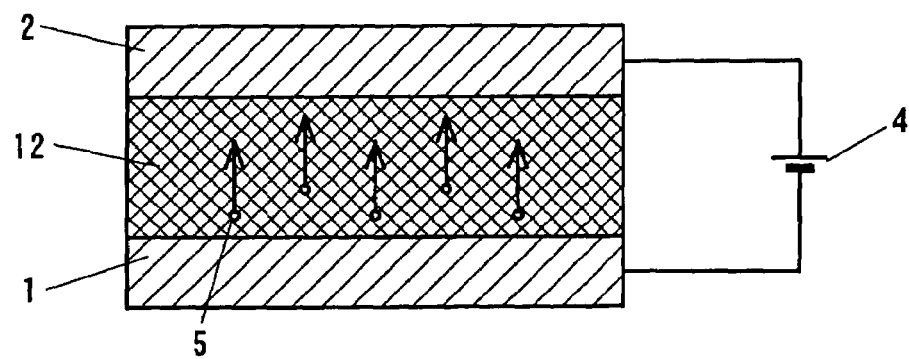
Figure 4:
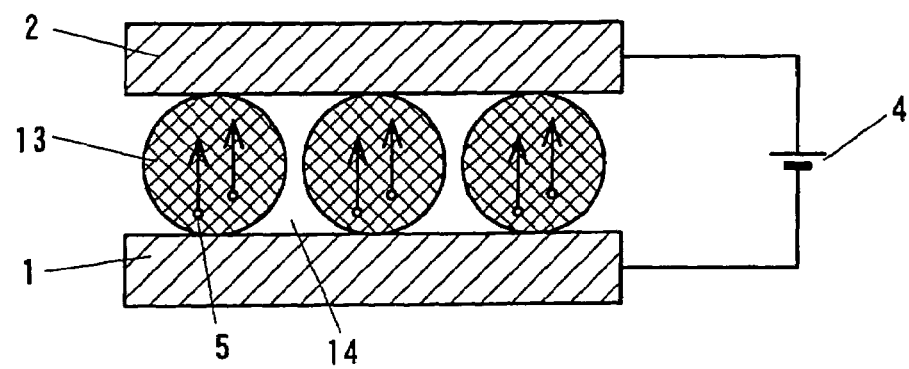

Next, the present invention is compared with the prior art example shown in FIG. 4(*b*). Unlike the prior art example, in which the electron transfer region that is sandwiched between the emitter 1 and the collector 2 as shown in FIG. 4(*b*) is a solid phase, since the electron transport layer 3 of the present invention comprises consecutive pores 7, it is possible to reduce the heat conduction from the hot collector 2 to the cold emitter 1. When the volume ratio of the vapor phase that is composed of consecutive pores 7 is 85% or more, since the solid frame section 6 that is capable of transmitting heat from the collector 2 to the emitter 1 is small in proportion to the electron transport layer 3, it is possible to efficiently reduce the heat conduction from the hot collector 2 to the cold emitter 1.

Next, the present invention is compared with the prior art example shown in FIG. 4(*c*). As in the example shown in FIG. 4(*a*), the uniformity of the vacuum space 10 thickness is lost in the prior art example shown in FIG. 4(*c*) due to the variation in the height of a solid phase 13; however, the electron transport layer 3 of the present invention does not suffer from such a drawback. In the prior art example shown in FIG. 4(*c*), energy loss is increased by the fine contact where the solid phase 13 is in contact with the emitter 1; however, because such a fine contact does not exist in the electron transport layer 3 of the present invention, it is possible to reduce such energy loss.

In the prior art example disclosed in WO No. 71759, a porous body is formed by anodization. As is well known, anodization is a technique in which only the surface of Si or aluminum is oxidized and the inner Si or aluminum remains unoxidized. When an Si layer or aluminum layer is anodized, a porous body which has a vapor phase and a solid phase will be obtained. The solid phase has an oxide of Si or aluminum on its surface, and Si or aluminum inside. When electrons are implanted into such a porous body, the electrons pass through the Si or aluminum inside and basically do not come out to the vapor phase. Although some electrons can jump over the oxide of Si or aluminum which exists on the surface of the solid phase and enter the vapor phase caused by the tunnel effect, since the number of such electrons is very few and the ratio of the solid phase is large in the porous body obtained by anodization, the electrons that jump into the vapor phase will collide with the solid phase easily. On the other hand, in the electron transport layer 3 of the present invention, electrons travel inside the vapor phase. This electron behavior seems to be the same as that inside a vacuum; however, the improved efficiency achieved by the ability of electrons to function like those in a vacuum is not described in the prior art example disclosed in WO No. 71759.

It is preferable that the thickness of the electron transport layer 3 of the present invention be not less than 10 nm and not more than 500 nm. It is difficult to form an electron transport layer 3 with a thickness of less than 10 nm, and in such a thin electron transport layer 3, it tends to also be difficult to effectively control the heat conduction from the collector 2 to the emitter 1 because the emitter 1 and the collector 2 are too near to each other. On the other hand, when the thickness of the electron transport layer 3 exceeds 500 nm, the risk that electrons will collide with the solid frame section 6 is increased, and it makes it difficult for electrons to travel in the vapor phase. Furthermore, the voltage applied across the emitter 1 and the collector 2 becomes higher and the electrical-energy efficiency tends to lower, and in the prior art examples shown in FIGS. 4(*a*) and (*c*), the "variation" in the height of the spacer 11 and the thickness of the solid phase 13 is removed, lessening the need to positively use the electron transport layer 3 of the present invention.

Dry gels produced by a sol-gel method can be exemplified as especially desirable candidates as a porous structure containing many such vapor phases. Here, dry gels are a nano porous body comprising a solid frame section composed of particles having a size of several to several tens of nm, and consecutive pores whose average pore diameter is about 100 nm or less. As the materials for the dry gel, electrically non-conductive substances and those that exhibit insulating characteristics with relatively high resistance (for example, metal oxides) are desirable, and, among those, a porous silica (porous oxidation silicon) and a porous alumina are particularly desirable. Wide band gap materials, such as diamond, boron nitride, aluminium nitride, etc., are also desirable.

Next, a method for manufacturing a porous body composed of dry gel for use as the electron transport layer 3 is explained by taking porous silica as an example. The method for producing porous silica composed of a dry gel mainly comprises, as explained below, the steps of forming a humid gel and drying it.

A humid gel is first synthesized by subjecting the silica material mixed in the solvent to a sol-gel reaction. At this time, a catalyst is used if needed. In this process, the material reacts in the solvent while producing fine particles, and the fine particles connect to form a three-dimensional network structure. Specifically, the material, which is a solid component, and the ratio of the chemical constituents of the solvent are selected in such a manner that a porous silica having pores with a predetermined volume ratio is formed. If necessary, a catalyst, a viscosity modifier, etc., are added to the solution prepared so as to have such a ratio of chemical constituents, the result is stirred, and the desired form is obtained by casting, coating, etc. By allowing the solution to stand for a certain period of time in this condition, the solution gels and a silica humid gel is formed. The temperature at the time of preparation may be near room temperature, which is the usual temperature for operation. However, if necessary, the temperature may be raised as long as it is below the boiling point of the solvent.

Tetramethoxysilane, tetraethoxysilane, trimethoxymethylsilane, dimethoxydimethylsilane and like alkoxysilane compounds and oligomers thereof; or a sodium silicate (silicic-acid soda), a potassium silicate and like water-glass compounds; or colloidal silica, etc., can be used singly or in combination as a silica material.

General solvents, such as water, methanol, ethanol, propanol, acetone, toluene, and hexane can be used singly or in combination as a solvent as long as it can dissolve the material and form silica.

Water; acids such as hydrochloric acid, sulfuric acid and acetic acid; and bases such as ammonia, pyridine, sodium hydroxide, and potassium hydroxide can be used as a catalyst.

Ethylene glycol, glycerin, polyvinyl alcohol, silicone oil, etc., can be used as a viscosity modifier, however, the viscosity modifier is not limited to these and can be suitably selected as long as it can form a humid gel into a predetermined form for use.

Next, a drying step for obtaining a dry gel from a humid gel is explained.

In the drying step, air drying, drying by heating, decompression drying and like general drying methods; a supercritical drying method; a freeze drying method; etc., can be employed. However, when a general drying method is employed, porous bodies usually shrink due to the stress caused by solvent evaporation. Therefore, as a method for forming a dry gel, it is desirable to use supercritical drying. It is also possible to prevent gel shrinkage when drying by applying a water-repellent to the surface of the solid component of the humid gel.

The solvent used for forming a humid gel can also be used as the solvent for supercritical drying. If necessary, it is preferable that the solvent be replaced beforehand with one that is easily handled in supercritical drying. Replacement solvents include methanol, ethanol, isopropyl alcohol and like alcohols; carbon dioxide; water; etc., that are used as a super critical fluid. It is also possible to replace the solvent with acetone, isoamyl acetate, hexane and like organic solvents that are easily eluted to a supercritical fluid, and which are usually easy to handle.

Supercritical drying is conducted in a pressurized container, such as an autoclave. For example, when methanol is used, the atmosphere is set at the critical condition of methanol, i.e., pressure of 8.1 MPa and temperature of not less than 239.4° C., and drying is conducted while gradually releasing the pressure under a set temperature. When carbon dioxide is used, the atmosphere is set at the critical pressure of 7.4 MPa and the critical temperature of not less than 31.1° C., and, in the same way as described in methanol, drying is conducted while gradually releasing the pressure at a set temperature. When water is used, the atmosphere is set at the critical pressure of 22.0 MPa and the critical temperature of not less than 374.2° C., and, in the same way as described in methanol, drying is conducted while gradually releasing the pressure at a set temperature. The duration for drying is not limited as long as it satisfies the time required for the solvent in the humid gel to be replaced at least one time with a supercritical fluid.

In a method wherein a humid gel is dried after applying a water-repellent treatment, the finishing agent for the water-repellent treatment is reacted with a solid component on the surface of the humid gel. This reduces the surface tension generated in the pores of the network structure in the humid gel, and prevents the shrinkage that occurs in general drying.

Examples of usable finishing agents include trimethylchlorosilane, dimethyldichlorosilane and like halogen-based silane agents; trimethylmethoxysilane, trimethylethoxysilane and like alkoxy-based silane agents; hexamethyldisiloxane, dimethyl siloxane oligomer and like silicone-based silane agents; hexamethyldisilazane and like amine-based silane agents; propyl alcohol, butyl alcohol and like alcohol based agents; etc. However, it is not limited to these finishing agents as long as the same effects can be obtained.

Furthermore, not only silica but also other inorganic materials, organic polymeric materials, etc., can be used as the materials for dry gels obtained by this method. The solid frame section of the dry gel of an inorganic oxide can be formed by using ordinary ceramics obtained by a sol-gel reaction, such as silica (silicon oxide) or an aluminum oxide (alumina) as a component.

EXAMPLE 1

With regard to a method for manufacturing a thermoelectric transducer as shown in FIG. 1, the features of the present invention are further clarified with reference to a concrete Example.

First, the production procedure of an emitter 1 is explained. A polyimide sheet with a thickness of 75 $\mu$m was first baked at 2700° C. under an argon (Ar) atmosphere, producing a carbon material comprising graphite as its main composition. In this baking process, barium (Ba) was added to give the carbon material a structure that is able to easily emit electrons. Although Ba was added in this Example, the added substance is not limited to this and other metals can be used as long as they are effective in reducing work function.

Subsequently, a copper (Cu) plate was prepared for use as a collector 2, and an electron transport layer 3 having a porous structure was formed thereon. In this Example, a porous silica layer with a thickness of about 100 nm for use as the electron transport layer 3 was formed by a sol-gel method.

Specifically, as a solution containing silica materials, tetramethoxysilane, ethanol, and ammonia solution (0.1 N) were mixed at a molar ratio of 1:3:4, and, after stirring, when the solution came to have a suitable viscosity, this gel material liquid was applied to a Cu plate by spin coating in such a manner that the thickness thereof was about 100 nm. Thereafter, the coated film gelled due to a sol polymerization reaction, and a silica humid gel structure composed of a three-dimensional network of Si—O—Si bonds as shown in FIG. 2 was formed. Although a porous silica layer with a thickness of about 100 nm was formed in this Example, the optimum value of this film thickness varies depending on the material of the emitter 1 and the voltage applied to the element by the power source connected to the element. A desirable film thickness is from not less than 10 nm to not more than 500 nm.

Next, after washing the sample wherein the silica humid gel was formed with ethanol (solvent exchange), supercritical drying using carbon dioxide was performed, producing a porous silica layer composed of a dry gel. The conditions for supercritical drying were a pressure of 12 MPa and a temperature of 50° C., and the sample was allowed to stand under this condition for four hours. Thereafter, the pressure was gradually released until it reached atmospheric pressure, and the temperature was then lowered. The volume ratio of the pores in the porous silica layer composed of the thus obtained dry gel was about 92%. The average pore diameter as measured by the Brunauer Emmett Teller method (the BET method) was about 20 nm. In the last step, the dried sample was annealed at 400° C. under a nitrogen atmosphere to remove the material adsorbed in the porous silica layer.

The emitter 1 and collector 2, which were produced as described above, were attached to each other by sandwiching an electron transport layer 3, which was composed of a porous silica layer, in a vacuum chamber, producing a thermoelectric transducer as shown in FIG. 1. In the vacuum chamber, a voltage was applied across the emitter 1 and the collector 2 in such a manner that the voltage of the collector 2 side became positive, the electrons were emitted from the emitter 1 to the electron transport layer 3, which was composed of a porous silica, and then the emission current and the temperatures of the emitter 1 and the collector 2 were measured. The emission current density was found to be several tens of $mA/cm^2$, and it was confirmed that the emitter 1 was cooled. Specifically, from the same temperature, the temperature of the emitter 1 was brought to about −30° C. and that of the collector 2 was brought to about 30° C.

EXAMPLE 2

A case where a porous silica layer which composes an electron transport layer 3 was formed by another method is explained below.

First, electrodialysis of a sodium silicate was performed to prepare a silicic-acid solution with pH 9 to pH 10 (the concentration of the silica component in the solution was about 14 wt %). After adjusting the silicic-acid solution to pH 5.5, the gel material solution was applied to a sample (Cu plate) by spin coating in such a manner that its thickness became about 100 nm. A silica humid gel layer having a coated film gelled and solidified was then formed.

The Cu plate onto which the silica humid gel layer was formed was made hydrophobic by dipping it into an isopropyl alcohol solution with 5 wt % of dimethyldimethoxysilane, and decompression drying was then conducted, producing a porous silica layer composed of a dry gel. The drying conditions were a pressure of 0.05 MPa and a temperature of 50° C. The sample was allowed to stand for three hours under these conditions. Thereafter, the pressure was gradually released until it reached atmospheric pressure, and the temperature was then lowered. The dried Cu plate was then annealed at 400° C. under a nitrogen atmosphere to remove the material adsorbed in the porous silica layer. As a result, a porous silica layer substantially the same as that of Example 1 was obtained.

The collector 2 comprising the thus obtained porous silica layer and the emitter 1 were attached to each other in a vacuum chamber by sandwiching the porous silica layer, producing a thermoelectric transducer as shown in FIG. 1. In the vacuum chamber, a voltage was applied across the emitter 1 and the collector 2 in such a manner that the voltage of the collector 2 side became positive, electrons were emitted from the emitter 1 to the electron transport layer 3, which was composed of a porous silica, and the emission current and the temperatures of the emitter 1 and the collector 2 were then measured. As a result, an emission current almost the same as in Example 1 was obtained and it was confirmed that the emitter 1 was cooled.

EXAMPLE 3

A thermoelectric transducer was produced by the method described in the first embodiment, but the conditions for forming the porous silica layer that serves as an electron transport layer 3 were varied, and the dependence of the cooling efficiency of the thus formed thermoelectric transducer was examined. As a result, when the volume ratio of the solid-phase component (reference number 6 of FIG. 2) of a porous silica layer became 15% or more, since the average energy of the electrons 5 emitted from the emitter 1 were reduced by diffusion, the cooling efficiency was found to fall remarkably.

When the size of the particles (reference number 6 of FIG. 2) composing the porous silica layer was 20 nm or more, a reduction in cooling efficiency was also observed for the same reason.

It is thus understood that the optimum conditions for producing a porous silica layer which forms a sufficiently strong three-dimensional network and is able to efficiently transfer the emitted electrons 5 and suppress heat conduction are a volume ratio for the solid-phase component (reference number 6 of FIG. 2) of less than 15% and a grain size of less than 20 nm and not less than 3 nm.

EXAMPLE 4

In Examples 1 to 3, the emitter 1 material was composed of a carbon material to which metallic elements were added; however, it was confirmed that when materials with a low work function, such as carbon materials, metals, metal alloys, and semiconductors, which are generally usable in such a thermoelectric transducer, are used for the emitter 1, the cooling effect correlates with the ease of the electron emission from the emitter 1. In other words, the easier the electron emission, the higher the cooling effect.

EXAMPLE 5

A case where an electron transport layer 3 as shown in FIG. 1 was formed using a different material is explained below. The materials for the emitter 1 and the collector 2 were the same as those of the first embodiment.

In this Example, a porous layer composed of diamond fine particles with a grain size of about 10 nm was formed. Specifically, after applying a paste containing the diamond fine particles with a concentration of 0.5 ct/cc to a Cu plate by spin coating in such a manner that the thickness thereof became about 100 nm, the Cu plate was baked at 400° C. under a nitrogen atmosphere to remove the paste component, and the diamond fine particles were thus adhered to the Cu plate. Observation of the obtained layer showed that the solid phase composed of the diamond fine particles was laminated to form a network, and that the gaps in the network were spaces (vapor phase), which is similar to the porous layer formed by the above-mentioned sol-gel method.

The emitter 1 and collector 2, which were produced as described above, were attached to each other in a vacuum chamber by sandwiching the porous diamond layer, and a thermoelectric transducer as shown in FIG. 1 was produced. In the vacuum chamber, a voltage was applied across the emitter 1 and the collector 2 in such a manner that the voltage of the collector side became positive, electrons 5 were emitted from the emitter 1 to the electron transport layer 3, which was composed of diamond fine particles and spaces (vapor phase), and the emission current and the temperatures of the emitter 1 and the collector 2 were measured. As a result, it was confirmed that the emitter 1 was cooled as in the case wherein a porous silica layer was used as the electron transport layer 3.

EXAMPLE 6

A case where a thermoelectric transducer as shown in FIG. 1 was used as a cooling means (heat pipe) of a compact refrigerator for storing food was compared with a case where cooling was conducted using a prior art Peltier element. As a result, the power consumption of the thermoelectric transducer type was about ⅕ that of the Peltier type. Thus, since the thermoelectric transducer of the present invention can achieve cooling operation with higher efficiency than the prior art type, the thermoelectric transducer is also usable as a heat sink for cooling exoergic components in equipment other than the refrigerator mentioned in this example.

(Second Embodiment)

In the first embodiment, the cooling operation of a single thermoelectric transducer was explained; however, it is also possible to manufacture a cooling device with high in-plane uniformity by two-dimensionally arranging a plurality of thermoelectric transducers and controlling the amount of thermoelectric conversion of each thermoelectric transducer.

Figure 3:
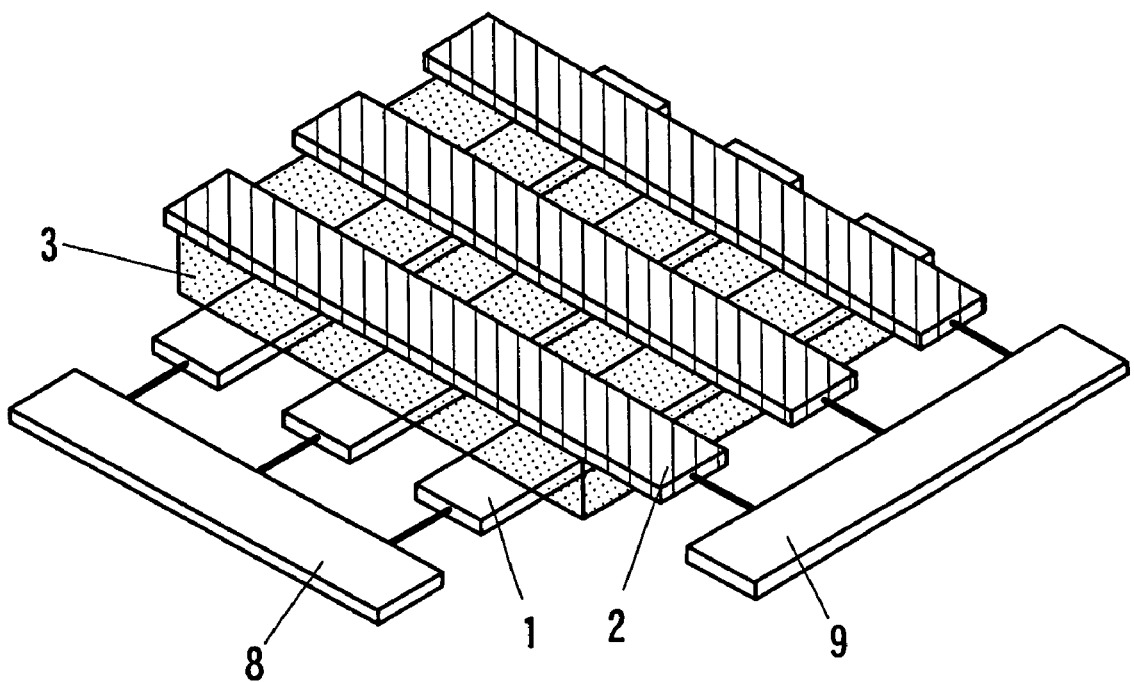
FIG. 3 is a perspective view showing the schematic structure of the cooling device formed by arranging a plurality of thermoelectric transducers of the present invention.

FIG. 3 is a perspective view showing the schematic structure of a cooling device in which a plurality of the thermoelectric transducers (a total of nine transducers in the three-line, three-row configuration in this figure) of FIG. 1 are arranged two-dimensionally. In the cooling device shown in FIG. 3, linear emitters 1 and linear collectors 2, which control the amount of emission current, are disposed on a base (not shown) so as to intersect each other at substantially right angles; an electron transport layer 3 is held between the emitters 1 and the collectors 2; and driving circuits 8 and 9 for applying a voltage to the emitters 1 and the collectors 2 respectively, are connected to the plurality of emitters 1 and collectors 2. By applying a voltage to the emitters 1 and the collectors 2 using the driving circuits 8 and 9 with time-sharing control or space-division control as is used to control the pixels in a liquid crystal display panel, it becomes possible to emit electrons from a desired electron emission section (where an emitter 1 and a collector 2 overlap) at a desired amount of electron emission, and, as a result, achieve a desired cooling pattern.

Furthermore, in the structure shown in FIG. 3, by controlling the pattern of the voltage applied by the driving circuits 8 and 9, a cooling surface can be achieved that has a smaller variation in temperature distribution and that operates more quickly compared to one in which the temperature is controlled only by an on-off action using a single thermoelectric transducer. Therefore, it can respond flexibly, without requiring the exchanging of cooling devices, when only a part of the object is to be cooled locally, the surface of the object to be cooled has a temperature distribution, or when the temperature distribution changes with time. For example, when the surface of the object to be cooled has a temperature distribution, by controlling the voltage applied to the plurality of collectors 1 and emitters 2 in such a manner that the cooling distribution of the plurality of emitters 1 thermally connected to the object corresponds to the temperature distribution, it is possible to cool the object at a substantially constant rate and with substantial uniformity.

In a portion that needs to be extensively cooled, cooling is promoted by causing more electrons to be emitted from the emitter 1 disposed in the corresponding location, and in a portion where extensive cooling is not required, the amount of the electrons emitted from the emitter 1 in the corresponding location is lessened (i.e., the potential difference between the emitter 1 and the collector 2 is made small by the driving circuits 8 and 9) or the emission of the electrons from the emitter 1 is stopped (i.e., put into an OFF state wherein the potential difference between the emitter 1 and the collector 2 is 0), and the object is thereby cooled at a substantially the same speed and uniformity. This reduces electrical energy consumed by the cooling device, i.e., saving power.

Even when a short-circuit occurs in some of the plurality of emitters 1 and collectors 2, since the object can be cooled using the emitters 1 and collectors 2 which have not been short-circuited, the cooling device of the present embodiment is highly reliable. In other words, if a voltage is applied not to the emitters 1 and the collectors 2 that were short-circuited but to the emitters 1 and the collectors 2 that were not short-circuited, a cooling effect can be achieved and the portions corresponding to the short-circuited emitters 1 and collectors 2 which are not directly cooled can also be cooled by heat conduction.

INDUSTRIAL APPLICABILITY

The thermoelectric transducer of the present invention is small and usable as a cooling element, and achieves effective cooling operation. Therefore, it is useful as a heat sink for devices/components that need to be cooled or as a heat pump or the like for a small refrigerator/freezer.

What is claimed is:

1. A thermoelectric transducer comprising:
   an emitter for emitting electrons;
   a collector disposed so as to face the emitter and collect electrons emitted from the emitter; and
   an electron transport layer held between the emitter and the collector;
   the electron transport layer being a porous body having a structure in which a vapor phase and a solid phase coexist;
   the entire solid phase being composed of an insulating material; and
   the electrons emitted from the emitter being made to travel in the vapor phase by applying a higher electric potential to the collector than to the emitter.

2. A thermoelectric transducer according to claim 1, wherein the surfaces of the emitter and the electron transport layer contact each other.

3. A thermoelectric transducer according to claim 1, wherein the surfaces of the collector and the electron transport layer contact each other.

4. A thermoelectric transducer according to claim 1, wherein the surfaces of the emitter and the collector contact the electron transport layer.

5. A thermoelectric transducer according to claim 1, wherein the insulating material composing the porous body is a metal oxide.

6. A thermoelectric transducer according to claim 5, wherein the metal oxide is silica or alumina.

7. A thermoelectric transducer according to claim 1, wherein the insulating material contains at least one member selected from the group consisting of diamond, boron nitride and aluminium nitride.

8. A thermoelectric transducer according to claim 1, wherein the volume ratio of the solid phase is less than 15%.

9. A thermoelectric transducer according to claim 1, wherein the solid phase is formed by a plurality of particles connecting mutually, and the diameter of each particle is less than 20 nm and not less than 3 nm.

10. A thermoelectric transducer according to claim 1, wherein the emitter is formed from a material that comprises carbon as a main component.

11. A thermoelectric transducer according to claim 10, wherein the material comprising carbon as a main component contains a metallic element as an impurity.

12. A thermoelectric transducer according to claim 1, wherein the thickness of the electron transport layer is not less than 5 nm and not more than 500 nm.

13. A method for manufacturing a thermoelectric transducer, the thermoelectric transducer comprising:
an emitter for emitting electrons;
a collector disposed so as to face the emitter and collect electrons emitted from the emitter; and
an electron transport layer held between the emitter and the collector;
the electron transport layer being a porous body having a structure in which a vapor phase and a solid phase coexist;
the entire solid phase being composed of an insulating material; and
the electrons emitted from the emitter being made to travel in the vapor phase by applying a higher electric potential to the collector than to the emitter;
the method comprising a step of forming the porous body using a sol-gel reaction.

14. A cooling device comprising a thermoelectric transducer and a power supply:
the thermoelectric transducer having;
an emitter for emitting electrons;
a collector disposed so as to face the emitter and collect electrons emitted from the emitter; and
an electron transport layer held between the emitter and the collector;
the electron transport layer being a porous body having a structure in which a vapor phase and a solid phase coexist;
the entire solid phase being composed of an insulating material;
the electrons emitted from the emitter being made to travel in the vapor phase by applying a higher electric potential to the collector than to the emitter; and
the power supply for applying a voltage across the emitter and the collector in such a manner that an electric potential higher than that applied to the emitter is applied to the collector.

15. A cooling device comprising a thermoelectric transducer and a driving circuit:
the thermoelectric transducer having;
a plurality of emitters for emitting electrons;
a plurality of collectors for collecting electrons emitted from the emitters, the plurality of collectors being disposed so as to face each of the emitters; and
an electron transport layer held between the emitters and the collectors;
the electron transport layer being a porous body having a structure in which a vapor phase and a solid phase coexist;
the entire solid phase being composed of an insulating material;
the electrons emitted from the emitters being made to travel in the vapor phase by applying a higher electric potential to the collectors than to the emitters; and
the driving circuit applying a voltage to the emitters and the collectors.

16. A method for controlling a cooling device comprising a thermoelectric transducer and a driving circuit:
the thermoelectric transducer having;
a plurality of emitters for emitting electrons;
a plurality of collectors for collecting electrons emitted from the emitters, the plurality of collectors being disposed so as to face each of the emitters; and
an electron transport layer held between the emitters and the collectors;
the electron transport layer being a porous body having a structure in which a vapor phase and a solid phase coexist;
the entire solid phase that composes the porous body being composed of an insulating material;
the electrons emitted from the emitters being made to travel in the vapor phase by applying a higher electric potential to the collectors than to the emitters; and
the driving circuit applying a voltage to the emitters and the collectors;
the method comprising;
a step of making the plurality of emitters to thermally connect to a surface of an object to be cooled; and
a step of controlling the driving circuit so that a voltage is applied to each emitter and collector in such a manner that the cooling distribution formed by the plurality of emitters corresponds to the temperature distribution on the surface which is thermally connected to the plurality of emitters.

17. A method for controlling a cooling device according to claim 16, which further comprises a step of controlling the driving circuit so that a voltage is applied to the plurality of emitters and collectors except those in which a short-circuit occurs.

* * * * *